(12) United States Patent
Uchida

(10) Patent No.: US 7,414,941 B2
(45) Date of Patent: Aug. 19, 2008

(54) DATA RECORDING DEVICE AND DATA REPRODUCING DEVICE

(75) Inventor: Akiyoshi Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 235 days.

(21) Appl. No.: 11/477,557

(22) Filed: Jun. 30, 2006

(65) Prior Publication Data

US 2006/0245325 A1 Nov. 2, 2006

Related U.S. Application Data

(62) Division of application No. 10/265,631, filed on Oct. 8, 2002, now Pat. No. 7,095,698.

(30) Foreign Application Priority Data

Mar. 13, 2002 (JP) ............................. 2002-069069

(51) Int. Cl.
*G11B 20/10* (2006.01)
(52) U.S. Cl. .................. 369/59.23; 369/59.24
(58) Field of Classification Search .......... None
See application file for complete search history.

(56) References Cited

U.S. PATENT DOCUMENTS

| | | | |
|---|---|---|---|
| 5,365,231 A | 11/1994 | Niimura | |
| 6,198,710 B1 | 3/2001 | Hori et al. | |
| 6,324,138 B1 | 11/2001 | Hori et al. | |
| 6,445,313 B2 | 9/2002 | Ahn | |
| 6,573,848 B2 | 6/2003 | Hayami | |

FOREIGN PATENT DOCUMENTS

| | | |
|---|---|---|
| JP | 62-030436 | 2/1987 |
| JP | 3-286624 | 12/1991 |
| JP | 6-176495 | 6/1994 |
| JP | 8-287617 | 11/1996 |
| JP | 2001-243725 A | 9/2001 |
| JP | 2001-285083 A | 10/2001 |

*Primary Examiner*—Paul W. Huber
(74) *Attorney, Agent, or Firm*—Arent Fox LLP

(57) ABSTRACT

The present invention provides a data recording device that can restrain the low-pass component in data to be written onto a recording medium without causing a problem in decoding the data using likelihood information. This data recording device includes: a data bit string combining unit that combines, by predetermined combining rules, a plurality of predetermined parity bit strings one by one with a data bit string obtained prior to a change to the bit order in a bit order rearranging procedure, thereby generating a plurality of composite data bit strings; and a data bit string selecting unit that selects one encoded data bit string from a plurality of encoded data bit strings generated through encoding procedures including the bit order rearranging procedure carried out for each of the plurality of composite data bit strings. Based on the selected encoded data bit string, the data recording device performs a data write operation onto the recording medium.

5 Claims, 11 Drawing Sheets

PRIOR ART FIG.1
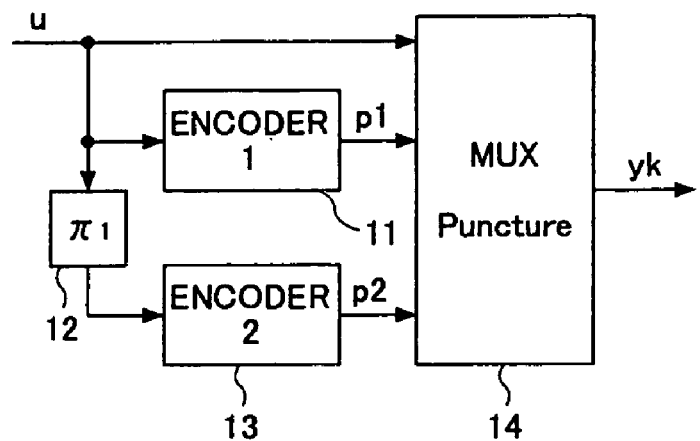
PRIOR ART FIG.2
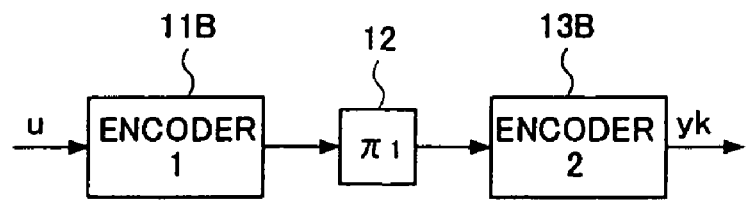

PRIOR ART FIG3
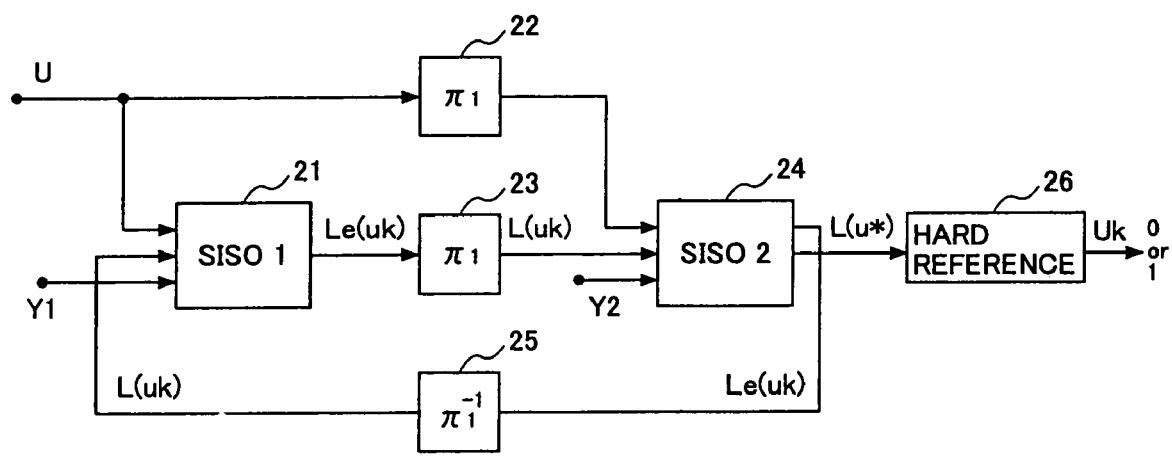

DATA RECORDING DEVICE AND DATA REPRODUCING DEVICE

This application is a divisional of U.S. patent application Ser. No. 10/265,631, filed Oct. 8, 2002 now U.S. Pat. No. 7,095,698, which is based upon and claims the benefit of priority from the prior Japanese Patent Application No. 2002-069069 filed on Mar. 13, 2002. The entire contents of these applications are incorporated herein by reference.

BACKGROUND OF THE INVENTION

The present invention generally relates to data recording devices such as magnetic disk devices, optical disk devices, and magnetic tape devices, and, more particularly, to a data recording device that rearranges and records data strings on a recording medium that can be set to a data reproducing device that reproduces recorded data in accordance with likelihood information generated from a reproduction signal.

The present invention also relates to a data reproducing device that is suitable for reproducing data from a recording medium on which data is recorded by the above data recording device.

A method of rearranging (interleaving) data in an encoding process has been employed as a technique for preventing burst errors in restored signals in a decoding process. A turbo encoding process and a repetitive decoding process have been used as an encoding and decoding technique respectively using the data rearranging method.

Turbo encoding is an encoding technique with a great encoding gain, and has been widely used in the field of communications. A turbo encoding device generally has two recursive structure convolution encoders for encoding a data bit string u, as shown in FIGS. 1 and 2.

In FIG. 1, the turbo encoding device includes a first encoder 11, an interleaver ($\pi$1) 12, a second encoder 13, and a combining unit 14. The data bit string u is supplied to the first encoder 11 and the second encoder 13 via the interleaver ($\pi$1) 12.

The first encoder 11 and the second encoder 13 are recursive structure convolution encoders. The first encoder 11 generates a parity bit string p1 from the supplied data bit string u. The interleaver ($\pi$1) 12 outputs a signal string having a different bit order from the inputted data bit string u. The second encoder 13 generates a parity bit string p2 from the signal string supplied from the interleaver ($\pi$1) 12.

The combining unit 14 combines the data bit string u, the parity bit string p1 outputted from the first encoder 11, and the parity bit string p2 outputted from the second encoder 13 by predetermined rules, to generate an encoded data bit string yk. In the process of combining the data bit string u, the parity bit string p1, and the parity bit string p2, the combining unit 14 removes certain bits (as a puncture function) to increase the encoding ratio. The encoded data bit string yk generated in this manner is outputted from the turbo encoding device. In a communication system, the encoded data bit string yk is modulated by predetermined rules, and is transmitted from a transmitter.

The turbo encoding device shown in FIG. 2 has two recursive convolution encoders (a first encoder 11B and a second encoder 13B) connected in series. In this structure, the data bit string u is encoded by the first encoder 11B, and the bit order in the signal string obtained by the encoding is rearranged by the interleaver ($\pi$1) 12. The signal string outputted from the interleaver ($\pi$1) 12 is encoded by the second encoder 13, and the signal string obtained by the encoding is outputted as the encoded data bit string yk.

After receiving the signal transmitted from the transmitter in the above manner, the receiver decodes the received signal to obtain signal value strings U, Y1, and Y2, respectively corresponding to the data bit string u and the parity bit strings p1 and p2 contained in the encoded data bit string yk. These signal value strings U, Y1, and Y2 are inputted into the decoding device corresponding to the turbo encoding device.

In the decoding device, soft output decoding is carried out by two decoders corresponding to the two encoders 11 and 13 (11B and 13B), and the soft output information (likelihood information) of each information bit obtained from one of the two decoders is supplied as a priori information to the other decoder. This operation is repeated by the decoding device, which has a structure shown in FIG. 3. FIG. 3 shows an example structure of the decoding device that processes the decoding signal value strings U, Y1, and Y2 corresponding to the data bit string u and the parity bit strings p1 and p2 contained in the encoded data bit string yk outputted from the turbo encoding device shown in FIG. 1.

In FIG. 3, the decoding device includes a first soft input-output decoder (SISO: Soft In Soft Out) 21, interleavers ($\pi$1) 22 and 23, a deinterleaver ($\pi1^{-1}$) 25, a second soft input-output decoder (SISO) 24, and a hard reference unit 26. The first soft input-output decoder 21 corresponds to the first encoder 11, and the second soft input-output decoder 24 corresponds to the second encoder 13.

The first soft input-output decoder 21 receives the signal value strings U and Y1 and the a priori information L(u) supplied from the second soft input-output decoder 24. The first soft input-output decoder 21 then carries out a maximum a posteriori probability (MAP) decoding process to estimate the a posteriori probability of each bit. Here, the a posteriori probability is the probability of a bit uk being 0 or 1 where the signal value string is Y(y0, y1, ..., y1, ..., yn). In the MAP decoding process, the log likelihood ratio L(u*) that is the log ratio of the a posteriori probability P (uk|Y) is calculated by the following formula:

$$L(u^*)=L(uk|Y)=\ln[P(uk=1|Y)/P(uk=0|Y)] \tag{1}$$

In this formula (1), the signal value string Y represents the signal value strings U and Y1.

The probability P (uk=1|Y) of the bit uk being 1 and the probability P (uk=0|Y) of the bit uk being 0 are calculated based on the Trelis diagram that represents the state transition obtained from the signal value strings U and Y1.

The log likelihood ratio L(u*) can be represented as follows:

$$L(u^*)=Lc \cdot yk+L(uk)+Le(uk) \tag{2}$$

wherein

Lc·yk represents the communication path value, with Lc representing the constant determined by S/N (the communication path value constant) and yk representing the received signal value string of y0, y1, ..., yn, L(uk) represents the a priori information that is the known appearance probability of the bit uk being 1 or 0, and Le(uk) represents the external likelihood information obtained with respect to the bit uk from code restraint.

From the formula (2), the first soft input-output decoder 21 calculates the external likelihood information Le(uk) by the following formula:

$$Le(uk)=L(u^*)-Lc \cdot yk-L(uk) \tag{3}$$

The log likelihood ratio L(u*) calculated in the above described manner (by the formula (1)) is assigned to the formula (3) to obtain the external likelihood information Le(uk). The string of the external likelihood information Le(uk) obtained in this manner is supplied as the string of the a priori information L(uk) to the second soft input-output decoder 24 via the interleaver ($\pi1$) 23. The second soft input-output decoder 24 also receives the signal value string Y2 as well as the signal value string U via the interleaver ($\pi1$) 22.

Taking the a priori information L(uk) into consideration, the second soft input-output decoder 24 calculates a new log likelihood ratio L(u*) by the formula (1). Using the new log likelihood ratio L(u*) and the a priori information L(uk) supplied from the first soft input-output decoder 21, the second soft input-output decoder 24 then calculates the external likelihood information Le(uk) by the formula (3).

The external likelihood information Le(uk) obtained by the second soft input-output decoder 24 is then supplied as the a priori information L(uk) to the first soft input-output decoder 21 via the deinterleaver ($\pi1^{-1}$) 25. Taking the a priori information L(uk) into consideration, the first soft input-output decoder 21 calculates the log likelihood ratio L(u*) and the external likelihood information Le(uk) in the above described manner. The external likelihood information Le(uk) obtained here is used as the a priori information L(uk) for the second soft input-output decoder 24.

In the above described manner, the first soft input-output decoder 21 and the second soft input-output decoder 24 repeat the process of calculating the log likelihood ratio L(u*), using the external likelihood information Le(uk) calculated by each other decoder as the a priori information L(uk). This process is referred to as a repetitive decoding process. In the first process carried out by the first soft input-output decoder 21, the a priori information L(uk) is set at zero (L(uk)=0).

The hard reference unit 26 determines whether the bit uk is 0 or 1, based on the log likelihood ratio L(u*) obtained by the second soft input-output decoder 24 after the decoding process has been repeated a predetermined number of times. If the log likelihood ratio L(u*) is positive (L(u*)>0), the hard reference unit 26 determines that the bit uk is 1 (uk=1). If the log likelihood ratio L(u*) is negative (L(u*)<0), the hard reference unit 26 determines that the bit uk is 0 (uk=0). The hard reference result is then outputted as a decoding result Uk.

In the above repetitive decoding process, the probability of the bit uk being an originally expected value (1 or 0) becomes greater, and the probability of the bit uk being an unexpected value becomes smaller (i.e., the difference between the probability of the bit uk being 1 and the probability of the bit uk being 0 becomes greater). The reliability of the reference by the hard reference unit 26 increases accordingly.

It is being considered that the turbo encoding and decoding method used in the communication system as described above should be applied to a data recording and reproducing device such as a magnetic disk device or an optical disk device. Examples of application of the turbo encoding and decoding method to a magnetic disk device are found in "W. E. Ryan, 'Performance of High Rate Turbo Codes on a PR4-Equalized Magnetic Recording Channel', Proc. IEEE Int. Conf. On Communications, pp 947-951, 1998".

In such a data recording and reproducing device, the above described turbo encoding method is employed in the recording system (the write system) for writing data onto a recording medium, and the above described repetitive decoding method is employed in the reproducing system (the read system) for reproducing the data from the recording medium. By employing these methods, the high-density data recording on the recording medium (such as a magnetic disk, an optical disk, an magneto-optical disk, or magnetic tape) can be reproduced with few errors.

The problem with a data reproducing device is generally the noise caused at the time of decoding data. The recording and reproducing properties of a data recording and reproducing device such as an optical disk device contain low-pass components, and a high-pass filter is normally used to restrain the noise caused by the low-pass components. A recording data string has a random bit order, and the cut-off frequency of the high-pass filter cannot be increased if the signal components of the recording string contain low-pass components. For this reason, the noise caused in the data recording and reproducing device cannot be effectively restrained.

To solve this problem, there is a known method for restraining the low-pass components in recording data by modulating the recording data or convoluting a predetermined bit string (or a parity bit string). According to this method, the low-pass components of a signal to be actually written onto a recording medium can be restrained by the data modulation or the convolution of a parity bit string, even of the recording data itself contains the low-pass components.

It is possible to apply the technique of data modulation and parity bit string convolution for removing the low-pass components to a data recording and reproducing device that rearranges the bit order in data in the data recording process and generates likelihood information (such as a log likelihood ratio) from a reproduction signal in the data reproducing process, like the above described data recording and reproducing device employing the turbo encoding method and the repetitive decoding method.

In such a data recording and reproducing device, however, the restraint of the low-pass components is not always guaranteed due to the rearrangement of the bit order, if the data modulation or the parity bit string convolution is carried out prior to the bit order rearrangement. On the other hand, if the data modulation or the parity bit string convolution is carried out after the data bit order rearrangement, accurate likelihood information corresponding to the actual recording data cannot be obtained in the data reproducing process.

Specific references to the prior art relating to the present invention include the following:

1) Japanese Laid-Open Patent Application No. 8-287617

This reference teaches a method of uniformly scattering information words after a process of rearranging the order of the information words in block data. According to this method, adverse influence due to a burst error in a data reproducing process can be reduced.

However, this reference does not teach a method for restraining the low-pass components in the data to be recorded.

2) Japanese Laid-Open Patent Application No. 3-286624

This reference teaches a method of determining such a control code pattern as to restrain the low-pass components in the signal components in data when an error detection and correction code is added to a data group containing information data and control data.

However, this method does not involve interleaving (or rearrangement) of the data.

3) Japanese Laid-Open Patent Application No. 6-176495

This reference teaches a method of inserting a bit into every unit word in data so that desired frequency characteristics can be obtained in the process of generating a recording signal.

However, this method does not involve interleaving (or rearrangement) of the data either.

4) Japanese Laid-Open Patent Application No. 62-030436

This reference teaches a method of restraining the low-pass components of the signal components in data by selecting a suitable position in information data to which an error detection and correction code is added.

However, this method does not involve interleaving (or rearrangement) of the data either.

SUMMARY OF THE INVENTION

A general object of the present invention is to provide data recording devices and data reproducing devices in which the above disadvantages are eliminated.

A more specific object of the present invention is to provide a data recording device that can restrain the low-pass components in data to be written onto a recording medium, without causing trouble in a data decoding process using likelihood information.

Another specific object of the present invention is to provide a data reproducing device that can reproduce the data from the recording medium onto which the data recording has been carried out by the above data recording device.

The above objects of the present invention are achieved by a data recording device that carries out encoding procedures including a bit order rearranging procedure for changing the bit order in data in a process of generating a data bit string to be written onto a recording medium from original data. This data recording device includes: a data bit string combining unit that combines a data bit string obtained prior to a change to the bit order in the bit order rearranging procedure with a plurality of parity bit strings, one by one, by predetermined combining rules, so as to generate a plurality of composite data bit strings; and a data bit string selecting unit that selects one encoded data bit string, by predetermined criteria, from a plurality of encoded data bit strings generated by carrying out the encoding procedures including the bit order rearranging procedure for each of the plurality of composite data bit strings obtained from the data bit string combining unit. This data recording device characteristically performs a data write operation onto the recording medium in accordance with the one encoded data bit string selected by the data bit string selecting unit.

In this data recording device, the plurality of composite data bit strings generated by combining the data bit string with the plurality of parity bit strings have different change characteristics (or frequency characteristics) from one another. The encoding procedures including the bit order rearranging procedure are then carried out for each of the plurality of composite data bit strings to obtain the plurality of encoded data bit strings of different change characteristics.

One encoded data bit string is then selected from the plurality of encoded data bit strings of different change characteristics (or frequency characteristics) by the predetermined criteria, and a data write operation is performed on the recording medium based on the selected one encoded data bit string.

The predetermined criteria for selecting one encoded data bit string are determined by the low-pass noise characteristics that are allowable in a data reproducing device that restores the original data from the recording medium onto which the data has been written in the above described manner. To restrict the low-pass noise to the lowest possible level, the criteria should be set in such a manner that the encoded data bit string having the low-pass component restricted to the lowest possible level can be selected.

The encoding procedures are not limited to specific kinds, as long as the bit order rearranging procedure such as turbo encoding is included.

The above objects of the present invention are also achieved by a data reproducing device that samples a signal reproduced from a recording medium in a predetermined cycle to obtain a sampling value string, generates a likelihood information string from the sampling value string through decoding procedures corresponding to the encoding procedures including the bit order rearranging procedure for the above data recording device, and restores the original data from the likelihood information string. This data reproducing device includes: a hard reference unit that carries out a hard reference process on the likelihood information string by predetermined criteria, and then outputs hard reference data bit strings; and a decoding unit that marks out the bit string corresponding to the parity bit string used in the data recording device from the hard reference data bit strings outputted from the hard reference unit, and decodes the hard reference data bit strings using the marked-out bit string by the rules corresponding to the combining rules employed in the data recording device, thereby restoring the original data.

The above objects of the present invention are also achieved by a data recording device that carries out encoding procedures including a bit order rearranging procedure for changing the bit order in data in a process of generating a data bit string to be written onto a recording medium from original data. This data recording device includes: a plurality of bit order rearranging units, each of which rearranges, by rearranging rules that are different among the bit order rearranging units from one another, the bit order in an encoded data bit string obtained by encoding the original data by predetermined rules, and then outputs a plurality of rearranged encoded data bit strings; an encoded data bit string selecting unit that selects, by predetermined criteria, one rearranged encoded data bit string from the plurality of rearranged encoded data bit strings outputted from the plurality of bit order rearranging units; and a parity adding unit that adds a parity bit string to a predetermined spot of the one rearranged encoded data bit string selected by the encoded data bit string selecting unit, so as to mark out the bit order rearranging unit that has outputted the one rearranged encoded data bit string. This data recording device characteristically performs a data write operation onto the recording medium in accordance with the one rearranged encoded data bit string, to which the parity bit string is added by the parity adding unit.

In this data recording device, the bit order in the encoded data bit string obtained by encoding the original data is rearranged by the plurality of bit order rearranging units to obtain the plurality of rearranged encoded data bit strings of different bit orders. The plurality of rearranged encoded data bit strings have different change characteristics (or frequency characteristics) from one another. One of the rearranged encoded data bit strings of different change characteristics is then selected by the predetermined criteria.

A parity bit is attached to the selected rearranged encoded data bit string, so that the bit order rearranging unit that has outputted the selected rearranged encoded data bit string can be marked out from the other bit order rearranging units. Based on the rearranged encoded data bit string provided with the parity bit, a data write operation is performed on the recording medium.

When the data is reproduced from the recording medium on which the data recording has been carried out in the above manner, the parity bit is extracted to detect the bit order rearranging unit that has been used in the encoding procedures. Accordingly, a process that corresponds to the process carried out by the detected bit order rearranging unit can be carried out in the decoding process carried out in the data reproducing operation.

The predetermined criteria for selecting one rearranged data bit string is determined by the low-pass noise characteristics that are allowable in a data reproducing device that restores the original data from the recording medium on which the data write has been carried out. To restrict the low-pass noise to the lowest possible level, the criteria should be set in such a manner that the rearranged encoded data bit string having the low-pass component restricted to the lowest possible level can be selected.

In this data recording device, the encoding procedures are not limited to specific kinds, as long as the bit order rearranging procedure such as turbo encoding is included.

The above objects of the present invention are also achieved by a data reproducing device that samples a signal reproduced from a recording medium in a predetermined cycle to obtain a sampling value string, generates a likelihood information string from the sampling value string through decoding procedures corresponding to the encoding procedures including the bit order rearranging procedure for the above data recording device, and then restores the original data from the likelihood information string. This data reproducing device includes: a plurality of information order rearranging units that change the order in the likelihood information string obtained through the decoding procedures by different rearranging rules, and output different rearranged likelihood information strings; and a selecting unit that generates a bit string corresponding to a parity bit string used in the data recording device from the likelihood information string obtained through the decoding procedures, and selects one information order rearranging unit that is represented by the bit string from the plurality of information order rearranging units. The one information order rearranging unit selected by the selecting unit performs an order rearranging operation on the likelihood information string in a process of restoring the original data from the sampling value string.

The above and other objects and features of the present invention will become more apparent from the following description taken in conjunction with the accompanying drawings.

BRIEF DESCRIPTION OF THE DRAWINGS

FIG. 1 is a block diagram showing an example structure of a conventional turbo encoding device;

FIG. 2 is a block diagram showing another example structure of a conventional turbo encoding device;

FIG. 3 is a block diagram showing an example structure of a decoding device corresponding to the turbo encoding device of FIG. 1;

DESCRIPTION OF THE PREFERRED EMBODIMENTS

The following is a description of embodiments of the present invention, with reference to the accompanying drawings.

Figure 4:
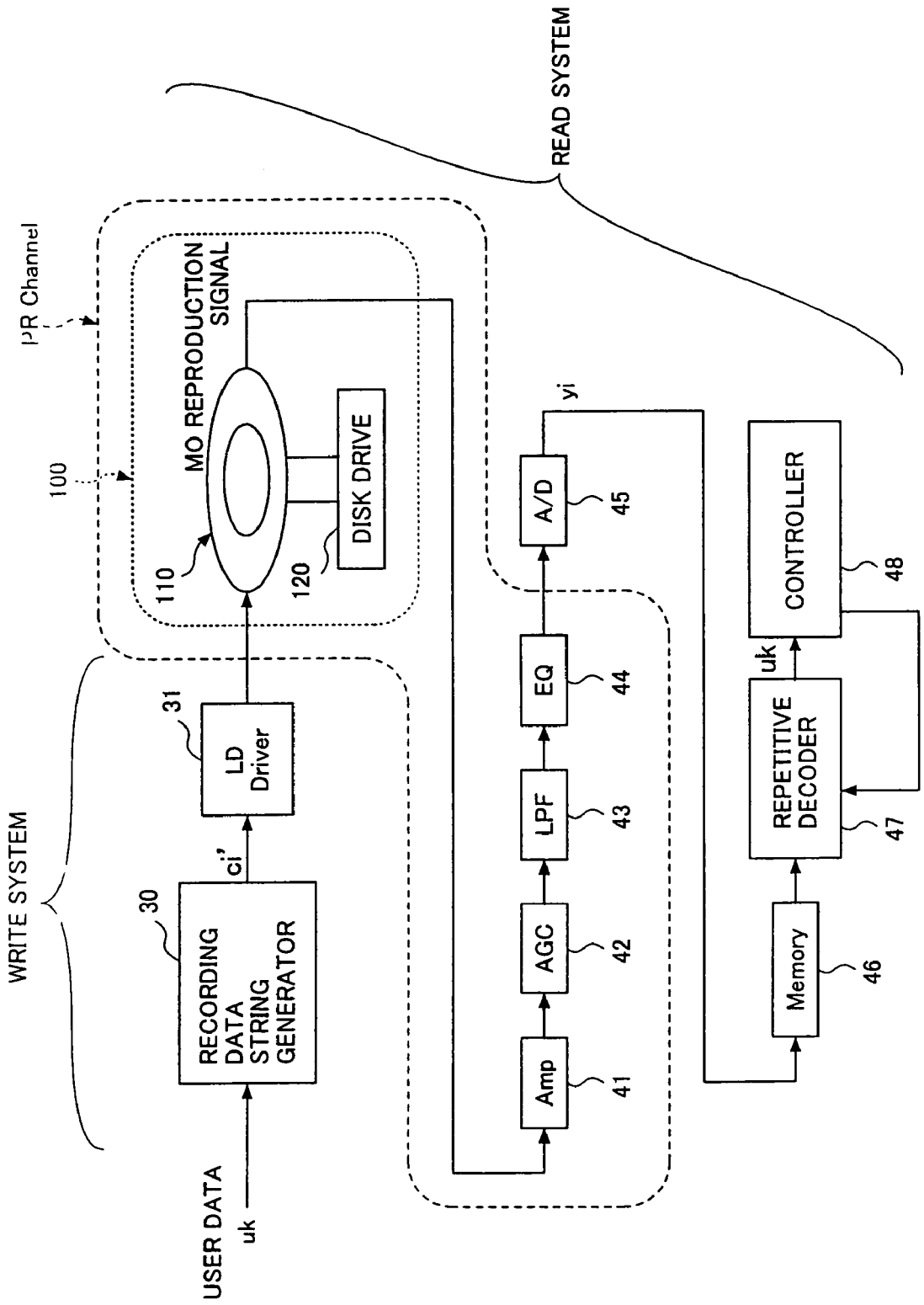
FIG. 4 shows a data recording and reproducing device as an embodiment of the present invention.

FIG. 4 shows a data recording device and a data reproducing device as an embodiment of the present invention. In FIG. 4, the data recording device is embodied by the write system of a data recording and reproducing device that records data onto a recording medium (a magneto-optical disk), while the data reproducing device is embodied by the read system of the data recording and reproducing device.

The data recording and reproducing device shown in FIG. 4 is an optical disk device that employs a magneto-optical (MO) disk 110 as a recording medium, and includes a recoding and reproducing mechanism 100, the write system for writing data onto the magneto-optical disk 110, and the read system for reproducing the data from the magneto-optical disk 110. The recording and reproducing mechanism 100 includes an optical beam output unit such as a laser diode, an optical head (not shown) equipped with a photodetector such as a photo diode, and a disk driver 120 that rotates the magneto-optical disk 110 at a predetermined speed.

The write system includes a recording data string generator 30 and LD driver circuit 31. The recording data string generator 30 carries out operations such as a parity-bit convolution process and an encoding process onto user data uk, and generates an encoded data bit string ci' that is to be written onto the magneto-optical disk 110. The LD driver circuit 31 performs a driving control operation on the optical beam output unit of the recording and reproducing mechanism 100, based on the encoded data bit string ci'. Signal write is carried out onto the magneto-optical disk 110 by the optical beam emitted from the optical beam output unit that is controlled based on the encoded data bit string ci'. This signal writing onto the magneto-optical disk 110 is carried out at such a high density as to cause predetermined waveform interference when the signal is reproduced.

Figure 5:
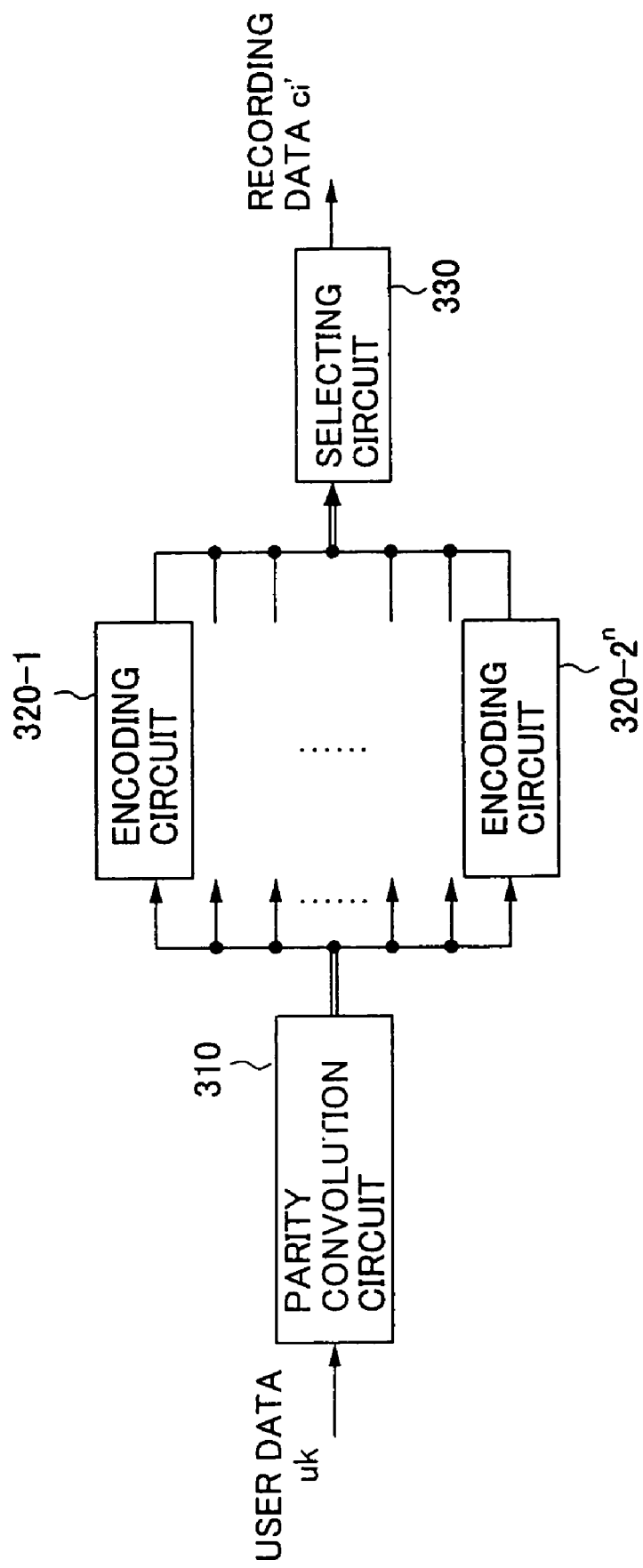
FIG. 5 is a block diagram showing an example structure of the recording data string generator of the data recording and reproducing device of FIG. 4.

FIG. 5 shows the structure of the recording data string generator 30.

In FIG. 5, the recording data string generator 30 includes a parity convolution circuit 310, a plurality of encoding circuits 320-1 through 320-$2^n$, and a select circuit 330. The parity convolution circuit 310 convolutes a predetermined parity bit string into the user data uk, so that the low-pass component of the data bit to be written onto the magneto-optical disk 110 can be restricted. In this convoluting process, a parity bit string of n bits is convoluted into user data of N bits. More specifically, the user data uk is divided into divisional bit strings A, B, C, . . . , each of which consists of n bits. The parity bit string of n bits and the first-divisional bit string A are convoluted (an exclusive OR operation for each bit) to generate a convoluted bit string A'. The convoluted bit string A' and the second divisional bit string B are then convoluted to generate the next convoluted bit string B'. Thereafter, every time a new convoluted bit string is generated, the new convoluted bit string and the next divisional bit string are convoluted in the same manner. As a result, a convolutional data bit string uk' having the parity bit string of n bits followed by the convolutional data bit strings A', B', C', . . . is obtained.

Figure 7:
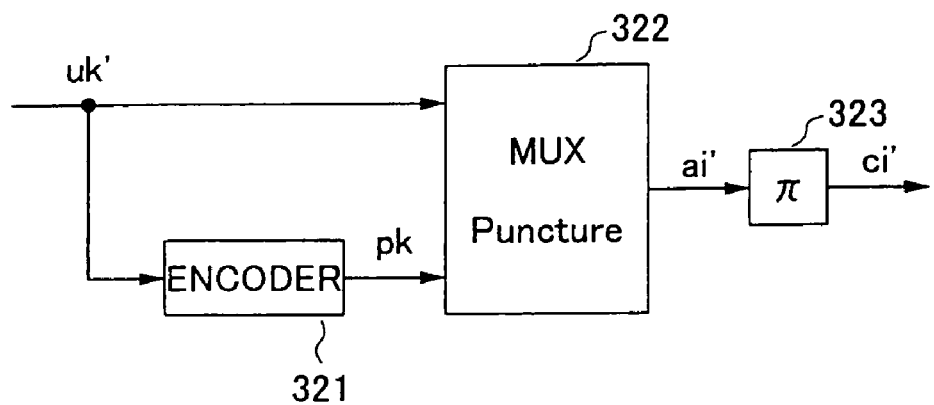
FIG. 7 is a block diagram showing an example structure of each of the encoding circuits of the recording data string generator of FIG. 5.

There are $2^n$ kinds of parity bit strings each consisting of n bits. The parity convolution circuit 310 carries out the above described convoluting process for all the parity bit strings. The parity convolution circuit 310 outputs $2^n$ of convolutional data bit strings uk', each of which is then supplied to each corresponding one of the encoding circuits 320-1 through 320-$2^n$. Each of the encoding circuits 320-1 through 320-$2^n$ carries out operations such as an encoding process and an interleaving process on the convolutional data bit string uk'. FIG. 7 shows an example structure of each of the encoding circuits 320-1 through 320-$2^n$.

Figure 8:
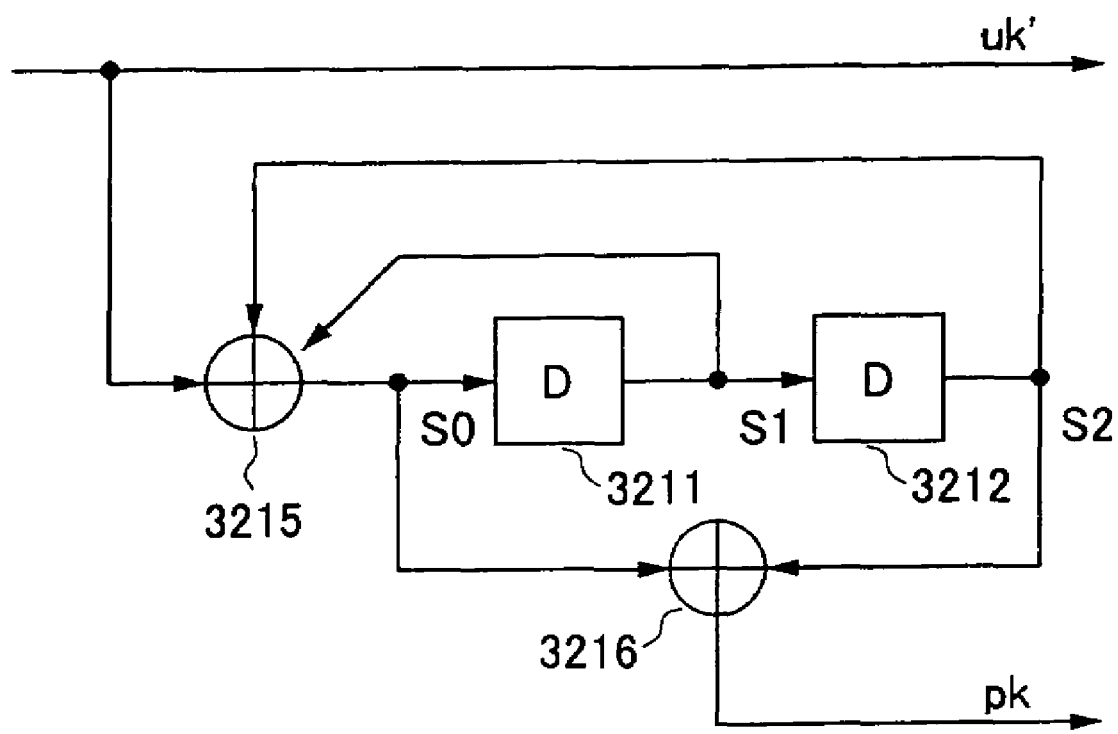
FIG. 8 shows an example structure of the encoder of each of the encoding circuits of FIG. 7.

In FIG. 7, each of the encoding circuits 320-1 through 320-$2^n$ includes an encoder 321, a coupler 322, and an interleaver ($\pi$) 323. The encoder 321 is a recursive structure convolution encoder that includes two delay elements 3211 and 3212 and two exclusive OR gates 3215 and 3216 as shown in FIG. 8. The encoder 321 performs an encoding operation with a restraint length of 3 on the convolutional data bit string uk' supplied from the parity convolution circuit 310, so as to generate a parity bit string pk corresponding to the convolutional data bit string uk'.

The coupler 322 couples the convolutional data bit string uk' with the parity bit string pk generated from the encoder 321 by predetermined rules, and then removes certain bits from the bit string obtained from the coupling process by predetermined rules (also known as a puncturing function), so as to generate an encoded data bit string ai'. The interleaver ($\pi$) 323 rearranges the encoded data bit string ai' provided from the coupler 322 by predetermined rules, so as to generate the encoded data bit string ci'.

Referring back to FIG. 5, the recording data string generator 30 selects one encoded data bit string ci' from the encoded data bit strings outputted from the encoding circuits 320-1 through 320-$2^n$. More specifically, the recording data string generator 30 calculates the DSV (Digital Sum Variation) of each of the encoded data bit strings outputted from the encoding circuits 320-1 through 320-$2^n$, and then selects the encoded data bit string ci' that has the DSV of the smallest maximum absolute value.

The DSVs are parameters representing variations of signals. With a signal having a short variation cycle (i.e., having a large amount of high-pass components), the maximum absolute value of the DSV is small. With a signal having a long variation cycle (i.e., having a large amount of low-pass components), the maximum absolute value of the DSV is large. Accordingly, the select circuit 330 selects the encoded data bit string having the smallest amount of low-pass components among the encoded data bit strings generated from the encoding circuits 320-1 through 320-$2^n$.

As described above, in the write system of the data recording and reproducing device, the user data uk is processed by N bits. In that process, the encoded data bit string ci' having the low-pass component that is restrained by the convoluting process of n-bit parity bit strings is supplied to the LD driver circuit 31. The encoded data bit string ci' is then written onto the magneto-optical disk 110 by the above described operation of the LD driver circuit 31.

The above convoluting process, the calculation of the DSVs, and the selection of the encoded data bit string can be carried out not in synchronization with the write operation of the LD driver circuit 31. To minimize the delay due to those processes and operations, they can be carried out in synchronization with a clock of a higher speed than the synchronous clock for the data write.

Referring back to FIG. 4, the read system of the data recording and reproducing device includes an amplifier 41, an AGC (Auto Gain Controller) 42, a low-pass filter 43, an equalizer 44, and an analog-digital (A-D) converter 45. An MO reproduction signal outputted from the photodetector of the recording and reproducing mechanism 100 is shaped into a waveform that can be regarded as a PR (Partial Response) waveform by the amplifier 41, the AGC 42, the low-pass filter 43, and the equalizer 44. In other words, a reproduction signal from the magneto-optical disk 110 is substantially encoded in a PR channel. Accordingly, the write system (the encoder 321 of each of the encoding circuits 320-1 through 320-$2^n$) and the substantial encoding function of the PR channel embody the structure of the turbo encoding device shown in FIG. 2.

The read system further includes a memory unit 46, a repetitive decoder 47, and a controller 48. The signal that has been subjected to the above waveform equalizing process is converted into a digital value (a sampling value) by the A-D converter 45 in a predetermined cycle, and the sampling value yi outputted from the A-D converter 45 is stored in the memory unit 46. The sampling value yi stored in the memory unit 46 is then decoded by the repetitive decoder 47 (a turbo decoding process). The controller 48 controls the operation and the decoding conditions of the repetitive decoder 47. The repetitive decoder 47 restores the user data string uk in a repetitive decoding process, and then outputs the user data string uk.

Figure 9:
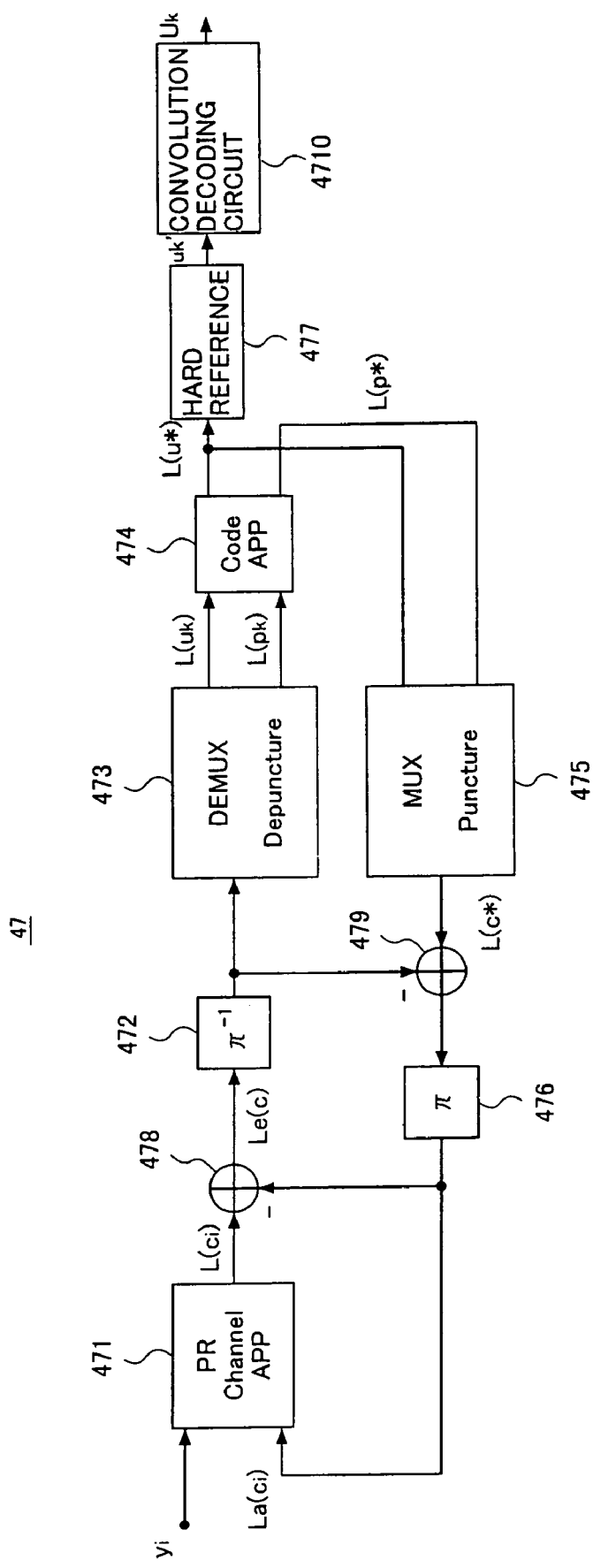
FIG. 9 is a block diagram showing an example structure of the repetitive decoder of the data recording and reproducing device of FIG. 4.

The repetitive decoder 47 has a decoder corresponding to the encoder 321 (see FIGS. 5 and 7) of each encoding circuit in the write system and the encoding function of the PR channel. FIG. 9 shows an example structure of the repetitive decoder 47.

In FIG. 9, the repetitive decoder 47 includes a PR channel decoder 471, a deinterleaver ($\pi^{-1}$) 472, a disassembler 473, a code decoder 474, a coupler 475, an interleaver ($\pi$) 476, a hard reference unit 477, subtractors 478 and 479, and a convolution decoding circuit 4710.

The PR channel decoder 471 is a decoder corresponding to the above described encoding function of the PR channel, and carries out an a posteriori probability decoding process (APP). More specifically, with a sampling value Y (y1, y2, . . . , yn) being detected, a log likelihood ratio L (ci*) based on the ratio of the probability P of the bit ci being 1 (ci=1|Y) to the probability P of the bit ci being 0 (ci=0|Y) is calculated.

$$L(ci^*)=\ln[P(ci=1|Y)/P(ci=0|Y)] \quad (4)$$

Each of the above probabilities can be calculated based on the Trelis diagram that represents the state transition of the sampling value yi.

Being calculated from the above equation (4), the log likelihood ratio L(ci*) is represented by a numeric value in a continuous range of a positive numeric value Lmax to a negative numeric value Lmin representing the probability range of the maximum probability of the bit ci being 1 to the maximum Probability of the bit ci being 0.

Likelihood information L(ci*) outputted from the PR channel decoder 471 is subtracted from a priori information La(ci) based on the output from the code decoder 474 (described later) by the subtractor 478 to obtain external likelihood information Le(c).

The order in the string of external likelihood information Le(c) is rearranged by the deinterleaver ($\pi^{-1}$) 472, and is then sent to the disassembler 473. The disassembler unit 473 disassembles the string of likelihood information into a string of likelihood information L(uk) with respect to the user data bits uk and a string of likelihood information L(pk) with respect to the parity bits pk. At the time of disassembling, information is added (a depuncturing function) by the rules corresponding to the puncturing (the puncturing function of the coupler 322) rules in the encoding process.

The code decoder 474 is a decoder corresponding to the encoder 321 of each of the encoding circuits 320-1 through 320-$2^n$ in the write system, and carries out the a posteriori probability decoding process (APP). More specifically, the code decoder 474 calculates the log likelihood ratio L(u*) represented by the a posteriori probabilities (the probability of uk being 1 and the probability of uk being 0) with respect to the user data bits uk, and the log likelihood ratio L(p*) represented by the a posteriori probabilities (the probability of pk being 1 and the probability of pk being 0) with respect to the parity bits, based on the a priori information L(uk), which is the likelihood information of the user data bits, and the a priori information L(pk), which is the likelihood information of the parity bits, respectively.

The string of the log likelihood ratios L(u*) and the string of the log likelihood ratios L(p*) successively outputted from the code decoder 474 are supplied to the coupler 475. The coupler 475 couples the string of the log likelihood ratios L(u*) with the string of the log likelihood ratios L(p*), and removes certain information from the coupled information by the predetermined rules (the puncturing function). As a result, likelihood information L(c*) is outputted from the coupler 475.

The a priori information Le(c) (prior to the disassembling into the information L(uk) and L(pk)) to be supplied to the code decoder 474 is subtracted from the above likelihood information L(c*) by the subtractor 479. The result is supplied to the interleaver (π) 476.

The string of the likelihood information rearranged by the interleaver (π) 476 is supplied as the a priori information La(ci) to the PR channel decoder 471, and is also sent to the subtractor 478.

In the manner described above, the repetitive decoder 47, which has the PR channel decoder 471 and the code decoder 474, carries out the repetitive decoding process, with one of the two decoders using the a priori information supplied from the other decoder.

The hard reference unit 477 determines whether each user data bit Uk' is 1 or 0, based on the log likelihood ratio L(u*) with respect to the data bit uk outputted from the code decoder 474 after the repetitive decoding process has been repeated a predetermined number of times. The hard reference unit 477 then outputs each data bit Uk' of the determined value. As described above, the log likelihood ratio L(u*) is represented by a positive number when the probability of the bit uk being 1 is greater than the probability of the bit uk being 0, and by a negative number when the probability of the bit uk being 1 is smaller than the probability of the bit uk being 0. Accordingly, the hard reference unit 477 actually uses a slice level of "0" to carry out the hard reference procedure based on the log likelihood ratio L(u*), and generates the data bits Uk'.

Figure 6:
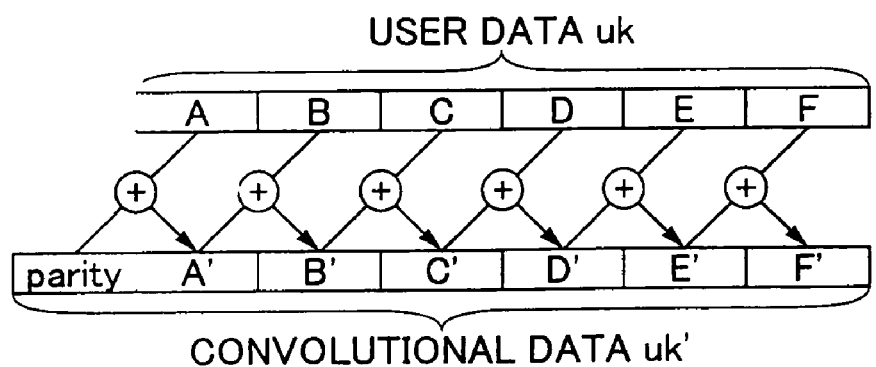
FIG. 6 shows an example operation of the parity convolution circuit of the data recording and reproducing device of FIG. 4.

The data bits Uk' outputted from the hard reference unit 477 correspond to the convolutional data bit string uk' (shown in FIG. 6) generated in the recording data generator 30. The data bit string Uk' corresponding to the convolutional data bit string uk' is then supplied to the convolution decoding circuit 4710. The convolution decoding circuit 4710 carries out a decoding process for the data bit string Uk' supplied from the hard reference unit 477, by the process rules corresponding to the process rules for the convolution carried out by the parity convolution circuit 310 (shown in FIG. 5).

Figure 10:
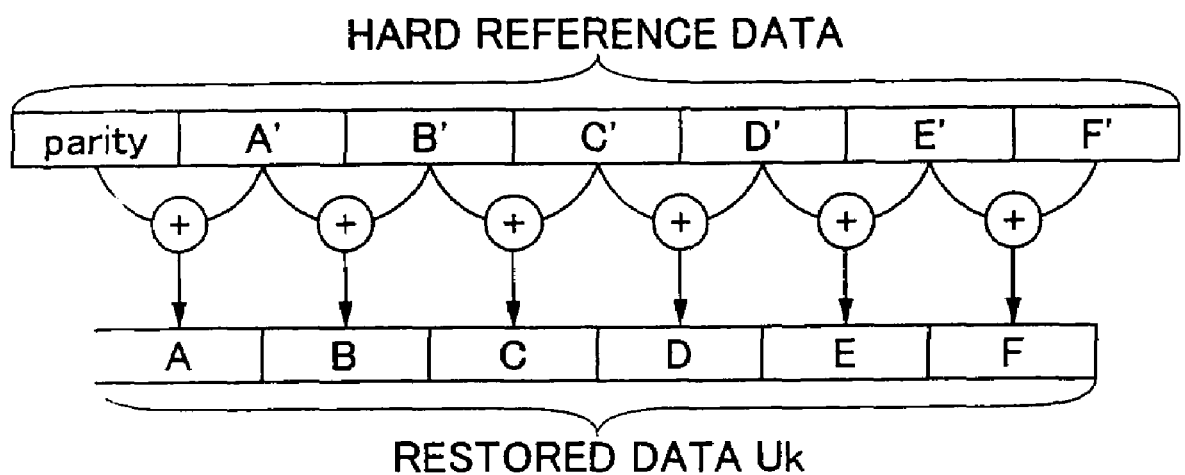
FIG. 10 shows an example operation of the convolution decoding circuit of the repetitive decoder of FIG. 9.

In this decoding process, the hard reference data (i.e., the data bit string Uk') outputted from the hard reference unit 477 is divided into bit strings by n bits, as shown in FIG. 10. As a result, an n-bit parity bit string is located at the top, followed by n-bit convolutional bit strings A', B', C', . . . . The parity bit string at the top is convoluted with the next convolutional bit string A' (an exclusive OR operation) to restore the original divisional bit string A. The convolutional bit string A' is then convoluted with the next convolutional bit string B' to restore the original divisional bit string B. In the same manner, each two neighboring convolutional bit strings are convoluted with each other. As a result, restored data Uk corresponding to the N-bit user data having the divisional bit strings A, B, C, . . . is obtained.

In the write system of the above described data recording and reproducing device, the user data uk to be recorded and the parity bit strings of $2^n$ kinds are convoluted with each other to generate the convolutional bit strings uk' of $2^n$, with the parity bit string being added to the top. The encoded data bit strings ci' of $2^n$ are then generated from the convolutional bit strings uk' of $2^n$. From the encoded data bit strings ci' of $2^n$, the encoded data bit string that has the smallest maximum absolute value of the DSV is selected. In other words, the encoded data bit string having the most restrained low-pass component among the encoded data bit strings ci' of $2^n$ is selected as the data bit string to be written.

In the read system of the data recording and reproducing device, the data bit string Uk' is restored from the magneto-optical disk 110, on which the selected encoded data bit strings have been written, by the repetitive decoding method. The data bit string Uk' is then decoded by the convoluting rules using the parity bit string located at the top of the data bit string Uk'. As a result, the restored data Uk is obtained finally.

In this data recordings and reproducing device, the encoding bit string having restrained low-pass components are written on the magneto-optical disk 110, even though the bit order is rearranged by the interleaver after the parity bit convolution process is carried out for the user data uk. Accordingly, the low-pass noise in a reproduction signal from the magneto-optical disk 110 should be restrained. Furthermore, since the convolutional data bit strings including the parity bit string are smoothly restored by the repetitive decoding process using the likelihood information (i.e., the log likelihood ratios), the original user data can be restored by carrying out the convolution encoding process for the convolutional data bit strings using the parity bit string.

Figure 11:
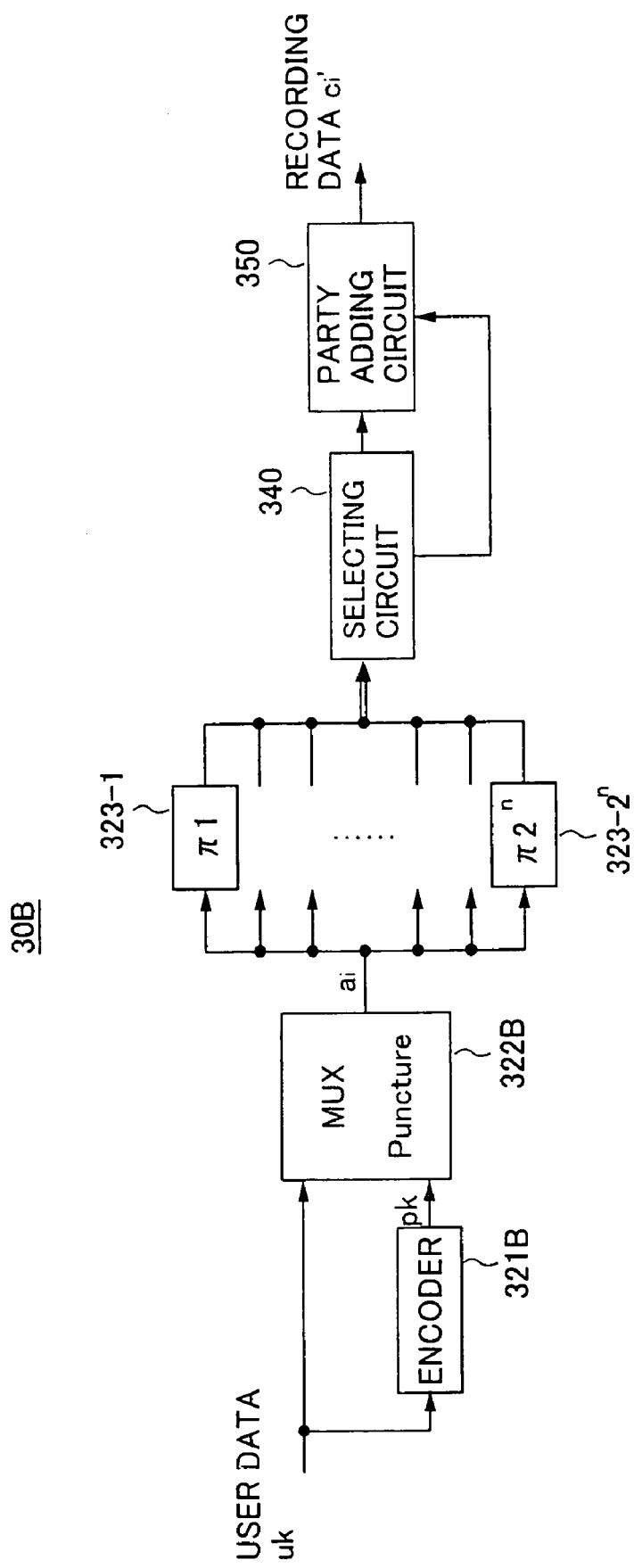
FIG. 11 is a block diagram showing another example structure of the recording data generator of the data recording and reproducing device of FIG. 4.

The recording data string generator 30 may have a structure shown in FIG. 11. In this modification, a single encoder and a plurality of interleavers of different characteristics are employed.

In FIG. 11, the recording data string generator 30B includes a single encoder 321B, a coupler 322B, and a plurality ($2^n$, for example) of interleavers 323-1 through 323-$2^n$), a selecting circuit 340, and a parity adding circuit 350. Like the encoder 321 of the recording data string generator 30, the encoder 321B is a recursive structure convolution encoder, and generates a parity bit string pk corresponding to the user data uk. Like the coupler 322, the coupler 322B couples the user data uk with the parity bit string pk supplied from the encoder 321B by the predetermined rules. The coupler 322B then removes certain bits from the coupled bit string (the puncture function) by the predetermined rules, and generates an encoded data bit string ai.

Each of the interleavers 323-1 through 323-$2^n$ rearranges the bit order of the encoded data bit string ai supplied from the coupler 322 by the order rearranging rules that differ among the interleavers 323-1 through 323-$2^n$. The selecting circuit 340 calculates the DSVs of the encoded data bit strings outputted from the interleavers 323-1 through 323-$2^n$, and selects the encoded data bit string having the smallest maximum absolute value of the DSVs. The selecting circuit 340 supplies the parity adding circuit 350 with the selected encoded data bit string and the information for marking out the interleaver that has outputted the selected encoded data bit string.

The parity adding circuit 350 adds an n-bit parity bit string (which can represent $2^n$ kinds of information) representing the information for marking out the above interleaver from the others, to a predetermined position (at the top, for example) of the encoded data bit string supplied from the selecting circuit 340. The parity adding circuit 350 thus generates the encoded data bit string ci' to be written onto the magneto-optical disk 110.

Figure 12:
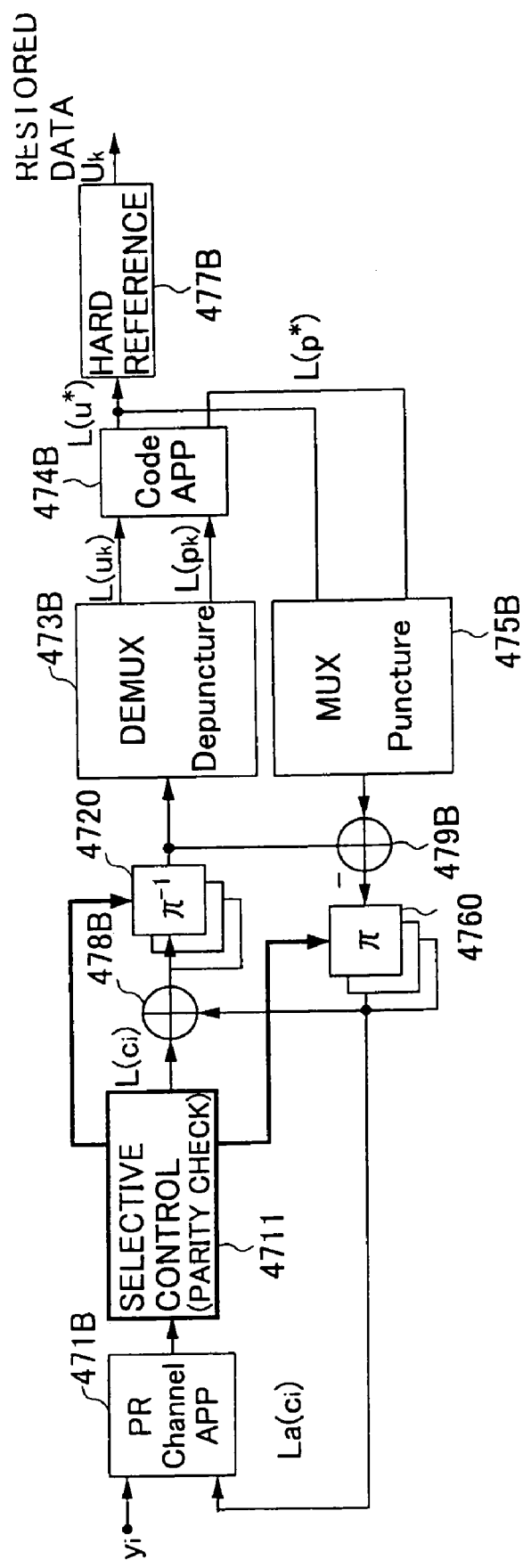
FIG. 12 is a block diagram showing another example structure of the repetitive decoder of the data recording and reproducing device of FIG. 4.

The repetitive decoder of the read system corresponding to the write system of the recording data string generator 30B having the above described structure may have a structure shown in FIG. 12.

In FIG. 12, the repetitive decoder 47B has the same turbo-decoding structure as shown in FIG. 9, except that a selective control circuit 4711 is employed instead of the convolution decoding circuit 4710 in the structure shown in FIG. 9, a deinterleaver set 4720 consisting of a plurality of deinterleavers corresponding to the plurality of interleavers 323-1 through 323-2$^n$ of the recording data string generator 30B is employed instead of the single deinterleaver 472, and an interleaver set 4760 consisting of a plurality of interleavers corresponding to the plurality of interleavers 323-1 through 323-2$^n$ is employed instead of the single interleaver 476.

In this repetitive decoder 47B, the selective control circuit 4711 carries out a hard reference procedure on the log likelihood ratio L(ci*) outputted as the a posteriori probability information from a PR channel decoder 471B, and then generates a decoded bit string. The selective control circuit 4711 further extracts, from the decoded bit string, the parity bit string that has been added to the predetermined position and represents the information for marking out the interleaver. The selective control circuit 4711 then selects, from the deinterleaver set 4720 and the interleaver set 4760, the deinterleaver and the interleaver corresponding to the interleaver distinguished by the extracted parity bit string.

The selected deinterleaver and the interleaver become valid in the repetitive decoder 47B. Using the deinterleaver and the interleaver corresponding to the interleaver used in the encoding process of the recording data string generator 30 of the write system, the repetitive decoder 47 carries out the repetitive decoding process, following the same procedures as described earlier in this specification.

When extracting the parity bit string that distinguishes the interleaver, the selective control circuit 4711 removes the string of the log likelihood ratios (the likelihood information) corresponding to the parity bit string from the string of the log likelihood ratios successively outputted from the PR channel decoder 471B. Thereafter, the above described repetitive decoding is carried out based on the string of the log likelihood ratios without the log likelihood ratios corresponding to the parity bit string.

In the write system of this data recording and reproducing device, the bit order in the encoded data bits ai obtained by encoding the user data uk to be recorded is rearranged by each of a plurality ($2^n$, for example) of interleavers. From a plurality of encoded data bit strings obtained as a result of the rearrangement of the bit order, the encoded data bit string having the smallest maximum absolute value of the DSVs is selected. A parity bit string representing the information for marking out the interleaver used for the selected encoded data bit string is then added to a predetermined spot of the selected encoded data bit string, so that the encoded data bit string ci' to be written onto the magneto-optical disk 110 is generated.

In this manner, the parity bit string and the encoded data bit string having the most restrained low-pass component among the plurality of encoded data bit strings are integrally written onto the magneto-optical disk 110.

In the read system of this data recording and reproducing device, the parity bit string is extracted from a decoded bit string obtained from a hard reference process carried out on the likelihood information string supplied from the PR channel decoder 471B, and the interleaver and the deinterleaver distinguished by the parity bit string are selected from a plurality of interleavers and a plurality of deinterleavers. The repetitive decoding process is then carried out, using the selected interleaver and deinterleaver.

With this data recording and reproducing device, encoded data bit strings having more restrained low-pass components are written onto the magneto-optical disk 110, and the user data can be smoothly restored from the magneto-optical disk 110 by the repetitive decoding method.

However, if an error occurs in the hard reference process carried out by the selective control circuit 4711 for the likelihood information supplied from the PR channel decoder 471B, the deinterleaver and the interleaver corresponding to the interleaver selected in the write system cannot be selected. An error correcting process to be carried out in such a case will be described below.

Figure 13:
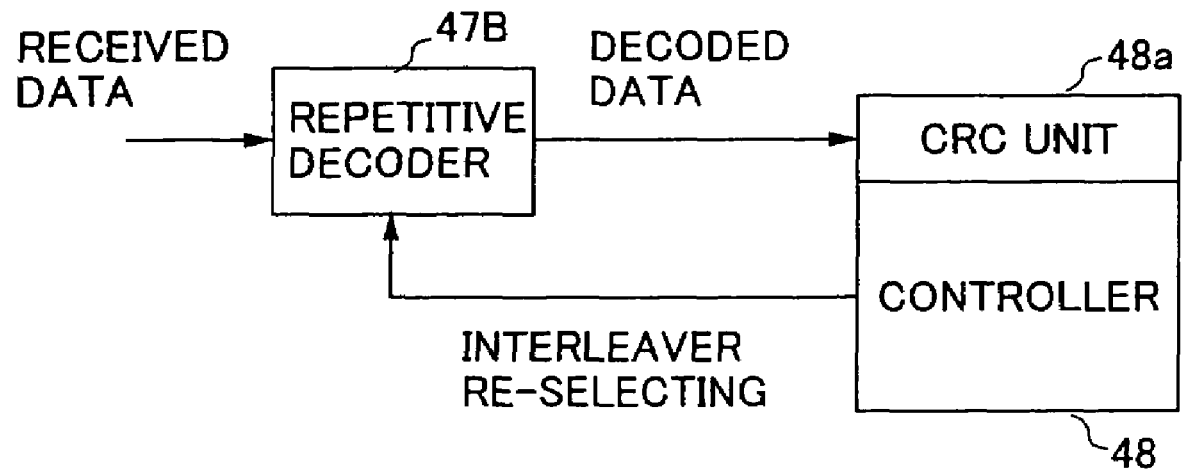
FIG. 13 is a block diagram showing an example structure for embodying a re-selecting function of the interleaver in the repetitive decoder of FIG. 12.

A check bit is added beforehand to each encoded data bit string ci' to be written onto the magneto-optical disk 110. As shown in FIG. 13, the controller 48 has a CRC (Cycle Redundancy Check) unit 48a. The CRC unit 48a carries out a CRC based on the check bit contained in the decoded data outputted from the repetitive decoder 47B shown in FIG. 12, so as to determine the bit error rate of the decoded data. Based on the bit error rate determined by the CRC unit 48a, the controller 48 supplies the repetitive decoder 47B with a control signal for re-selecting an interleaver and a deinterleaver. Upon receipt of the control signal for re-selecting, the repetitive decoder 47B selects a suitable deinterleaver and a suitable interleaver from the deinterleaver set 4720 and the interleaver set 4760, and then carries out the repetitive decoding process again.

If the repetitive decoder 47B selects a wrong deinterleaver and a wrong interleaver, the decoding result is as full of errors as in a case where a hard reference process is carried out for the likelihood information equivalent to a probability of ½. Therefore, the controller 47 can easily re-select a deinterleaver and an interleaver, based on the bit error rate determined by the CRC unit 48a. If the bit error condition has not reached a predetermined level, the above described procedure for re-selecting a deinterleaver and an interleaver is repeated.

In this manner, even if an error repeatedly occurs in the hard reference process carried out by the selective control circuit 4711 for the likelihood information supplied from the PR channel decoder 471, the deinterleaver and the interleaver corresponding to the interleaver selected in the write system can be selected, and the user data can be accurately restored.

Although the data recording and reproducing device employs the turbo encoding and decoding method in the above described embodiments, the present invention is not limited to any particular encoding and decoding method, as long as the bit order in a data bit string is rearranged in the encoding process.

Also, the structure of the above described write system can be applied to a device for data recording only, while the structure of the above described read system can be applied to a device for data reproducing only.

In each of the above described embodiments, the parity convoluting circuit 310 shown in FIG. 5 can be referred to as a data bit string combining unit, and the selecting circuit 330 shown in FIG. 5 can be referred to as a data bit string selecting unit. The convolution decoding circuit 4710 shown in FIG. 9 can also be referred to as a decoding unit.

The interleavers 323-1 through 323-2$n$ shown in FIG. 11 can also be referred to as a plurality of bit order rearranging units, and the selecting circuit 340 shown in FIG. 11 can also be referred to as an encoded data bit string selecting unit. The deinterleaver set 4720 and the interleaver set 4760 shown in FIG. 12 can also be referred to as a plurality of information order rearranging units, and the selective control circuit 4711 shown in FIG. 12 can also be referred to as a selecting unit.

It should be noted that the present invention is not limited to the embodiments specifically disclosed above, but other variations and modifications may be made without departing from the scope of the present invention.

What is claimed is:

1. A data reproducing device that samples a signal reproduced from a recording medium in a predetermined cycle to obtain a sampling value string, generates a likelihood information string from the sampling value string through decoding procedures corresponding to encoding procedures including a bit order rearranging procedure for a data recording device, and restores original data from the likelihood information string, said data reproducing device comprising:
 a hard reference unit that carries out a hard reference process on the likelihood information string by predetermined criteria, and then outputs hard reference data bit strings; and
 a decoding unit that marks out the bit string corresponding to a parity bit string used in the data recording device from the hard reference data bit strings outputted from the hard reference unit, and decodes the hard reference data bit strings using the marked-out bit string by rules corresponding to combining rules employed in the data recording device, thereby restoring the original data.

2. A data recording device that carries out encoding procedures including a bit order rearranging procedure for changing the bit order in data in a process of generating a data bit string to be written onto a recording medium from original data, said data recording device comprising:
 a plurality of bit order rearranging units, each of which rearranges, by rearranging rules that are different among the bit order rearranging units from one another, the bit order in an encoded data bit string obtained by encoding the original data by predetermined rules, and then outputs a plurality of rearranged encoded data bit strings;
 an encoded data bit string selecting unit that selects, by predetermined rules, one rearranged encoded data bit string from the plurality of rearranged encoded data bit strings outputted from the plurality of bit order rearranging units; and
 a parity adding unit that adds a parity bit string to a predetermined spot of the one rearranged encoded data bit string selected by the encoded data bit string selecting unit, so as to mark out the bit order rearranging unit that has outputted the one rearranged encoded data bit string, said data recording device performing a data write operation onto the recording medium in accordance with the one rearranged encoded data bit string, to which the parity bit string is added by the parity adding unit.

3. The data recording device as claimed in claim 2, wherein the data bit string selecting unit calculates a predetermined parameter representing the change characteristics of each of the plurality of rearranged encoded data bit strings, and then selects the one rearranged encoded data bit string based on the predetermined parameter calculated from each of the plurality of rearranged encoded data bit strings.

4. A data reproducing device that samples a signal reproduced from a recording medium in a predetermined cycle to obtain a sampling value string, generates a likelihood information string from the sampling value string through decoding procedures corresponding to encoding procedures including a bit order rearranging procedure for a data recording device, and then restores original data from the likelihood information string, said data reproducing device comprising:
 a plurality of information order rearranging units that change the order in the likelihood information string obtained through the decoding procedures by different rearranging rules, and output different rearranged likelihood information strings; and
 a selecting unit that generates a bit string corresponding to a parity bit string used in the data recording device from the likelihood information string obtained through the decoding procedures, and selects one information order rearranging unit that is represented by the bit string from the plurality of information order rearranging units, wherein the one information order rearranging unit selected by the selecting unit performs an order rearranging operation on the likelihood information string in a process of restoring the original data from the sampling value string.

5. The data reproducing device as claimed in claim 4, further comprising:
 an error condition detecting unit that detects an error condition in the restored original data; and
 a re-selecting unit that selects another information order rearranging unit from the plurality of information order rearranging units based on the detection result supplied from the error condition detecting unit.

* * * * *